(12) United States Patent
Fiorelli et al.

(10) Patent No.: US 8,896,393 B2
(45) Date of Patent: Nov. 25, 2014

(54) COUPLING INTERFACES FOR COMMUNICATION TRANSCEIVERS OVER POWER LINES

(71) Applicant: STMicroelectronics S.r.l., Agrate Brianza (IT)

(72) Inventors: Riccardo Fiorelli, Sirtori (IT); Antonio Cataliotti, Palermo (IT); Dario Di Cara, Palermo (IT); Giovanni Tine, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/905,984

(22) Filed: May 30, 2013

(65) Prior Publication Data

US 2013/0257560 A1 Oct. 3, 2013

Related U.S. Application Data

(63) Continuation of application No. PCT/EP2011/073554, filed on Dec. 21, 2011.

(30) Foreign Application Priority Data

Dec. 22, 2010 (IT) .............................. VA2010A0098

(51) Int. Cl.
*H03H 7/38* (2006.01)
*H04B 3/56* (2006.01)
*H03H 7/00* (2006.01)

(52) U.S. Cl.
CPC ........ *H03H 7/004* (2013.01); *H04B 2203/5491* (2013.01); *H04B 3/56* (2013.01)
USPC ............ 333/124; 333/126; 333/129; 333/132

(58) Field of Classification Search
USPC ......................... 333/124–126, 127, 128, 132
See application file for complete search history.

(56) References Cited

U.S. PATENT DOCUMENTS

| 2,756,414 A | 7/1956 | Doremus |
| 2004/0227622 A1 | 11/2004 | Giannini et al. |

FOREIGN PATENT DOCUMENTS

EP 1850501 10/2007

OTHER PUBLICATIONS

IEEE Power Engineering Society, "643™: IEEE Guide for Power-Line Carrier Applications," IEEE Standard 643-2004, Revision of IEEE Std 643-1980, Jun. 8, 2005, 143 pages.
IEC, "Live working—Part 5: Voltage detection systems (VDS)," IEC 61243-5: Internal Standard, Reference No. CEI/IEC 61243-5: 1997, First edition, 1997-06, 114 pages.
Benato et al., "Application of Distribution Line Carrier-based protection to prevent DG islanding: an investigating procedure," IEEE Bologna Power Tech Conference Proceedings, Jun. 23-26, Bologna, Italy, 2003, 7 pages.

(Continued)

*Primary Examiner* — Robert Pascal
*Assistant Examiner* — Kimberly Glenn
(74) *Attorney, Agent, or Firm* — Seed IP Law Group PLLC

(57) ABSTRACT

A coupling interface couples a transceiver to one or more capacitive voltage dividers of a power transmission system. The coupling interface includes a first signal path including an adjustable inductance configured to form a resonance circuit with a capacitance associated with the one or more capacitive voltage dividers. The coupling interface may include a second signal path including an adjustable inductance configured to form a resonance circuit with the capacitance associated with the one or more capacitive voltage dividers.

29 Claims, 10 Drawing Sheets

(56) References Cited

OTHER PUBLICATIONS

Capetta et al., "L'evoluzione del Sistema T&D—Metodiche di comunicazione per il monitoraggio, il controllo e le protezioni della reti di distribuzione," CESI Ricerca, Feb. 2008, 91 pages.

Cataliotti et al., "A Medium-Voltage Cables Model for Power-Line Communication," *IEEE Transactions on Power Delivery* 24(1):129-135, Jan. 2009.

Cataliotti et al., "Power Line Communication in Medium Voltage Systems: Characterization of MV Cables," *IEEE Transactions on Power Delivery* 23(4):1896-1902, Oct. 2008.

Wouters et al., "Effect of Cable Load Impedance on Coupling Schemes for MV Power Line Communications," *IEEE Transactions on Power Delivery* 20(2):638-645, Apr. 2005.

British Standards Institution (BSI), "Signalling on low-voltage electrical installations in the frequency range 3 kHz to 148,5 kHz—Part 1: General requirements, frequency bands and electromagnetic disturbances," BS EN 50065-1:2011, 36 pages.

COUPLING INTERFACES FOR COMMUNICATION TRANSCEIVERS OVER POWER LINES

BACKGROUND

1. Technical Field

This disclosure relates to interfaces for transceivers, such as interface architectures for coupling transceivers, transmitters or receivers to power lines.

2. Description of the Related Art

Power line communication (PLC) systems are used in many countries for low voltage power network remote control and remote protection and for remote metering of user energy consumption.

The amount of transferred data for these purposes is limited. Therefore the CENELEC EN 50065-1 "A" band reserved for energy utilities, which corresponds to a frequency range from 5 to 95 kHz, can guarantee an adequate data transfer rate. See, EN 50065-1 "Signalling on low-voltage electrical installations in the frequency range 3 to 148.5 kHz—Part 1: General requirements, frequency bands and electromagnetic disturbances."; P. A. A. F. Wouters, P. C. J. M. van der Wielen, J. Veen, P. Wagenaars, E. F. Steennis, "Effect of cable load impedance on coupling schemes for MV power line communication," IEEE Trans. Power Del., vol. 20, no. 2, pp. 638-645, April 2005. Likewise in Northern America and in Japan the same services can be supplied with PLC because the regulation is more permissive and frequencies up to 525 kHz can be used, i.e., up to the AM broadcast threshold. A further reference for PLC systems is the IEEE standard 643-2004. See, IEEE Standards-643TM IEEE Guide for Power Line-Carrier Applications, IEEE Std. 643, Jun. 8, 2005.

In recent years energy suppliers are showing an increasing interest for the use of power line communication also in the medium voltage (MV) network, instead of the wireless or GSM communication systems. These communication methods have weak reliability (particularly in bad weather conditions) and high intrinsic (additional) costs. On the other hand the actual solutions for PLC application in the MV network need a dedicated MV coupler, capacitive or inductive, to be installed near each MV/LV transformer substations.

This solution is technically effective but present MV couplers are not so easy to be installed inside the existing MV switchboard. Moreover, the installation needs an interruption of the electrical power.

A problem for PLC application in the MV network is the design and engineering of the MV coupler for the PLC signal. The coupler must have low impedance for the PLC signal and high impedance for the main frequency voltage. Other problems for PLC application in the MV network are the high voltage level, the behavior of the power transformers and of the power cables at the PLC signal frequency.

In the scientific literature there are few studies about medium voltage power line behavior in the PLC frequency range. See, A. Cataliotti, A. Daidone, G. Tinè, "Power line communications in Medium Voltage system: Characterization of MV cables", IEEE Transactions on Power Delivery, vol. 23, n. 4, October 2008; A. Cataliotti, A. Daidone, G. Tinè, "A Medium Voltage Cable model for Power Line Communication", IEEE Transactions on Power Delivery, vol. 24, n. 1, pp. 129-135, January 2009. All the actual commercial solutions use a dedicated coupling network, capacitive or inductive, which has to be installed all over the MV network. See R. Benato, R. Caldon, F. Cesena, "Application of Distribution Line Carrier-based protection to prevent DG islanding: an investigative procedure", Power Tech Conference Proceedings IEEE, Vol. 3, 23-26 Jun. 2003 Bologna.

In 2008 L. Capetta and C. Tornelli, studied the possibility to use the capacitive divider of a VDS as PLC coupler for the MV power network. See L. Capetta, C. Tornelli: "L'evoluzione del Sistema T&D—Metodiche di comunicazione per il monitoraggio, il controllo e le protezioni delle reti di distribuzione" February 2008 Cesi Ricerca. They compared the performance of a dedicated MV coupler with the performance of a capacitive divider of a VDS according to the prescriptions of the IEC 61243-5. They concluded that the capacitive divider can be used for the reception of the PLC signal but not for the transmission. Moreover, the authors suggest realizing a high impedance receiver but do not explain how to adapt the receiver to the capacitive divider to obtain the higher received signal. Finally the authors concluded that the capacitive divider can not be used for bidirectional communication but only for the network characterization.

BRIEF SUMMARY

Novel architectures of coupling interfaces that may be used for coupling transceivers, or even transmitters or receivers, to power lines, have been found.

In an embodiment, limitations of the known transmission/reception techniques may be overcome by exploiting the capacitive voltage dividers that are already installed in the MV switchboards and are composed of the isolators directly connected to the power lines and a capacitor connected between the isolator and the ground. According to an embodiment, an adjustable inductance is connected in parallel to a capacitor of a capacitive voltage divider or between the intermediate nodes of two voltage dividers, in order to constitute a resonant circuit tuned at the frequency of the transmitted/received signal, and signals are transmitted/received by connecting a transmitter/receiver in parallel to the adjustable inductance.

Embodiments of architectures of coupling interfaces adapted to implement the disclosed method are also disclosed.

In an embodiment, a coupling interface of a communication signal transmitter to either a capacitive voltage divider connected between a power line and ground or between intermediate nodes of two capacitive voltage dividers each connected between a respective power line and ground, said interface being connectable electrically in parallel to a capacitor of said capacitive voltage divider or between said intermediate nodes of the two capacitive voltage dividers, comprises: at least an adjustable inductance of a value adapted to constitute, together with said capacitor or with the capacitance between said intermediate nodes, a L-C resonant circuit at transmission carriers of communication signals of said transmitter; and an impedance matching circuit connected upstream said adjustable inductance adapted to match the output impedance of said communication signal transmitter to the impedance of said L-C resonant circuit.

In an embodiment, a coupling interface of a communication signal receiver to either a capacitive voltage divider connected between a power line and ground or between intermediate nodes of two capacitive voltage dividers each connected between a respective power line and ground, said interface being connectable electrically in parallel to a capacitor of said capacitive voltage divider or between said intermediate nodes of the two capacitive voltage dividers, comprises: at least an adjustable inductance of a value adapted to constitute, together with said capacitor or with the capacitance between said intermediate nodes, a L-C resonant circuit at transmission carriers of communication signals of said receiver; and a pass-band filter connected downstream said adjustable inductance, adapted to filter out all signals at frequencies different from frequencies of said transmission carriers.

In an embodiment, a coupling interface of a communication signal transceiver to either a capacitive voltage divider connected between a power line and ground or between intermediate nodes of two capacitive voltage dividers each connected between a respective power line and ground, said interface being connectable electrically in parallel to a capacitor of said capacitive voltage divider or between said intermediate nodes of the two capacitive voltage dividers, comprises: a transmission path including at least an adjustable inductance of a value adapted to constitute, together with said capacitor or with the capacitance between said intermediate nodes, a L-C resonant circuit at transmission carriers of communication signals of said transceiver, and an impedance matching circuit connected upstream said adjustable inductance adapted to match the output impedance of said communication signal transceiver to the impedance of said L-C resonant circuit; a reception path having at least a second adjustable inductance and a pass-band filter connected downstream said adjustable inductance, adapted to filter out all signals at frequencies different from frequencies of said transmission carriers; and switching means adapted to connect either said capacitor or the capacitance between said intermediate nodes electrically in parallel to either said first or second inductance and to connect the transceiver either to said transmission path or to said reception path. In an embodiment, the coupling interface further comprises: a first amplifier connected in said transmission path immediately downstream said communication signal transceiver; and a second amplifier connected in said reception path immediately upstream said communication signal transceiver. In an embodiment, the coupling interface is adapted to be connected between intermediate nodes of two capacitive voltage dividers of respective power lines, comprising two adjustable inductances connected in said transmission path between a respective output node of the transmission path and ground, said impedance matching circuit being referred to one of said output nodes. In an embodiment, the coupling interface is adapted to be connected between intermediate nodes of two capacitive voltage dividers of respective power lines, comprising two adjustable inductances connected in said reception path between a respective output node of the transmission path and ground, said pass-band filter being referred to one of said output nodes. In an embodiment, said impedance matching circuit comprises a transformer, the primary winding of which is connected to an input node of the transmission path and is referred to ground, and the secondary winding of which is galvanically isolated from said primary winding and comprises an adjustable L-C network. In an embodiment, the coupling interface is realized in integrated form as a monolithic interface board having a pair of input terminal adapted to be coupled to a transmitter or receiver or transceiver, a pair of output terminals adapted to be connected between said power line and ground or between said intermediate nodes of two capacitive voltage dividers, and a terminal to be connected to ground.

In an embodiment, a method of transmitting/receiving signals over a power line having either only one capacitive voltage divider connected between a power line and ground or at least two capacitive voltage dividers each connected between a respective power line and ground, comprising the steps of: connecting an adjustable inductance of a value adapted to constitute, together with a capacitor of said voltage divider or with the capacitance between the intermediate nodes of said two capacitive voltage dividers, a L-C resonant circuit at transmission carriers of communication signals of said transmitter; and connecting a transmitter/receiver in parallel to said adjustable inductance, transmitting/receiving signals over the power line using said transmitter/receiver.

In an embodiment, a coupling interface comprises: a first terminal configured to couple to a capacitive voltage divider of a power transmission system; a second terminal configured to couple to the power transmission system; a transceiver terminal configured to couple to a transceiver; a first signal path including: one or more adjustable inductors configured to form a resonance circuit with a capacitance across the first and second terminals at one or more receiving frequencies; and a pass-band filter configured to pass signals at the one or more receiving frequencies; a second signal path including: one or more adjustable inductors configured to form a resonance circuit with a capacitance across the first and second terminals at one or more transmission frequencies; and impedance matching circuitry; and switching circuitry configured to: in a first mode of operation, couple the first signal path between the first terminal and the transceiver terminal; and in a second mode of operation, couple the second signal path between the first terminal and the transceiver terminal. In an embodiment, the second terminal is configured to couple to a ground of the power transmission system. In an embodiment, the second terminal is configured to couple to a second capacitive voltage divider of the power transmission system. In an embodiment, the switching circuitry is configured to: in the first mode of operation, couple a first adjustable inductor of the first signal path to the first terminal and a second adjustable inductor of the first signal path to the second terminal; and in the second mode of operation, couple a first adjustable inductor of the second signal path to the first terminal and a second adjustable inductor of the second signal path to the second terminal. In an embodiment, the first and second adjustable inductors of the second signal path are coupled to the impedance matching circuitry. In an embodiment, the impedance matching circuitry comprises: a transformer having a primary winding coupled to a ground and a secondary winding galvanically isolated from the primary winding; and an adjustable inductance-capacitance network coupled to the secondary winding. In an embodiment, in the second mode of operation, the switching circuitry is configured to couple the primary winding to the transceiver terminal. In an embodiment, the first and second adjustable inductors of the first signal path are coupled to the pass-band filter. In an embodiment, the first signal path comprises an amplifier having an input coupled to the pass-band filter and the second signal path comprises an amplifier having an output coupled to the impedance matching circuitry. In an embodiment, the coupling interface comprises an integrated circuit including the first and second signal paths and the switching circuitry.

In an embodiment, a system comprises: a transceiver; and a coupling interface, including: a first terminal configured to couple to a capacitive voltage divider of a power transmission system; a second terminal configured to couple to the power transmission system; a first signal path including: one or more adjustable inductors configured to form a resonance circuit with a capacitance across the first and second terminals at one or more receiving frequencies; and a pass-band filter configured to pass signals at the one or more receiving frequencies; a second signal path including: one or more adjustable inductors configured to form a resonance circuit with a capacitance across the first and second terminals at one or more transmission frequencies; and impedance matching circuitry; and switching circuitry configured to: in a first mode of operation, couple the first signal path between the first terminal and the transceiver; and in a second mode of operation, couple the second signal path between the first terminal and the transceiver. In an embodiment, the second terminal is configured to couple to a ground of the power transmission system. In an embodiment, the second terminal is configured to couple to a second capacitive voltage divider of the power transmission system. In an embodiment, the switching circuitry is configured to: in the first mode of operation, couple a first adjustable inductor of the first signal path to the first terminal and a second adjustable inductor of the first signal path to the second terminal; and in the second mode of operation, couple a first adjustable inductor of the second signal path to the first terminal and a second adjustable inductor of the second signal path to the second terminal. In an embodiment, the first and second adjustable inductors of the second signal path are coupled to the impedance matching circuitry. In an embodiment, the impedance matching circuitry comprises: a transformer having a primary winding coupled to a ground and a secondary winding galvanically isolated from the primary winding; and an adjustable inductance-capacitance network coupled to the secondary winding. In an embodiment, in the second mode of operation, the switching circuitry is configured to couple the primary winding to the transceiver. In an embodiment, the first and second adjustable inductors of the first signal path are coupled to the pass-band filter. In an embodiment, the first signal path comprises an amplifier having an input coupled to the pass-band filter and the second signal path comprises an amplifier having an output coupled to the impedance matching circuitry.

In an embodiment, a system, comprises: first means for coupling a transceiver to a first capacitive voltage divider of a power transmission system; second means for coupling the transceiver to the first capacitive voltage divider of the power transmission system; and means for selecting one of the first and second means for coupling to couple the transceiver to the power transmission system. In an embodiment, the first means for coupling is configured to couple to a second capacitive voltage divider of the power transmission system and the second means for coupling is configured to couple to the second capacitive voltage divider of the power transmission system. In an embodiment, the means for selecting is configured to: when the first means for coupling is selected, couple a first adjustable inductor of the first means for coupling to the first capacitive voltage divider and a second adjustable inductor of the first means for coupling to the second capacitive voltage divider; and when the second means for coupling is selected, couple a first adjustable inductor of the second means for coupling to the first capacitive voltage divider and a second adjustable inductor of the second means for coupling to the second capacitive voltage divider. In an embodiment, the second means for coupling comprises: a transformer having a primary winding coupled to a ground and a secondary winding galvanically isolated from the primary winding; and an adjustable inductance-capacitance network coupled to the secondary winding.

In an embodiment, a method comprises: coupling a transceiver to at least a first capacitive voltage divider of a power transmission system; transmitting signals from the transceiver to the power transmission system; and receiving signals from the power transmission system, wherein the coupling the transceiver to the at least a first capacitive voltage divider of the power transmission system comprises: coupling the transceiver to the first capacitive voltage divider through a first signal path when receiving a signal, the first signal path including: one or more adjustable inductors configured to form a resonance circuit with a capacitance associated with the first capacitive voltage divider at one or more receiving frequencies; and a pass-band filter configured to pass signals at the one or more receiving frequencies; and coupling the transceiver to the first capacitive voltage divider through a second signal path when transmitting a signal, the second signal path including: one or more adjustable inductors configured to form a resonance circuit with the capacitance associated with the first capacitive voltage divider at one or more transmission frequencies; and impedance matching circuitry. In an embodiment, the capacitance associated with the first capacitive voltage divider comprises a capacitance between a node of the first capacitive voltage divider and a ground. In an embodiment, the capacitance associated with the first capacitive voltage divider comprises a capacitance between a node of the first capacitive voltage divider and a node of a second capacitive voltage divider of the power transmission system.

In an embodiment, a coupling interface comprises: a first terminal configured to couple to an intermediate node of a capacitive voltage divider, the capacitive voltage divider being coupled between a power line and a ground; a second terminal; a third terminal configured to couple to a communication device; a first set of one or more adjustable inductors configured to form a resonance circuit with a capacitance across the first and second terminals at one or more communication frequencies; and the first coupling circuitry configured to couple between the one or more adjustable inductors and the third terminal. In an embodiment, the first coupling circuitry comprises a pass-band filter configured to pass signals at the one or more communication frequencies. In an embodiment, wherein the first coupling circuitry is configured to match an impedance to an impedance of the resonance circuit. In an embodiment, the coupling interface comprises: a first signal path including: the first set of one or more adjustable inductors, wherein the first set of one or more adjustable inductors are configured to form the resonance circuit at one or more receiving frequencies of the one or more communication frequencies; and the first coupling circuitry, wherein the first coupling circuitry comprises a pass-band filter configured to pass signals at the one or more receiving frequencies; and a second signal path including: a second set of one or more adjustable inductors configured to form a resonance circuit with a capacitance across the first and second terminals at one or more transmission frequencies of the one or more communication frequencies; and impedance matching circuitry; and switching circuitry configured to: in a first mode of operation, couple the first signal path between the first terminal and the third terminal; and in a second mode of operation, couple the second signal path between the first terminal and the third terminal. In an embodiment, the second terminal is configured to couple to the ground. In an embodiment, the second terminal is configured to couple to an intermediate node of a second capacitive voltage divider, the second capacitive voltage divider being coupled between a second power line and the ground. In an embodiment, the second terminal is configured to couple to an intermediate node of a second capacitive voltage divider, the second capacitive voltage divider being coupled between a second power line and the ground, and the switching circuitry is configured to: in the first mode of operation, couple a first adjustable inductor of the first set of one or more adjustable inductors to the first terminal and a second adjustable inductor of the first set of one or more adjustable inductors to the second terminal; and in the second mode of operation, couple a first adjustable inductor of the second set of one or more adjustable inductors to the first terminal and a second adjustable inductor of the second set of adjustable inductors to the second terminal. In an embodiment, the first and second adjustable inductors of the second set of one or more adjustable inductors are coupled to the impedance matching circuitry. In an embodiment, the impedance matching circuitry comprises: a transformer having a primary winding coupled to the ground and a secondary winding galvanically isolated from the primary winding; and an adjustable inductance-capacitance network coupled to the secondary winding. In an embodiment, in the second mode of operation, the switching circuitry is configured to couple the primary winding to the third terminal. In an embodiment, the first and second adjustable inductors of the first set of one or more adjustable inductors are coupled to the pass-band filter. In an embodiment, wherein the first signal path comprises an amplifier having an input coupled to the pass-band filter and the second signal path comprises an amplifier having an output coupled to the impedance matching circuitry. In an embodiment, the coupling interface comprises an integrated circuit including the first and second signal paths and the switching circuitry.

In an embodiment, a system comprises: a communication device; and a coupling interface, including: a first terminal configured to couple to an intermediate node of a capacitive voltage divider, the capacitive voltage divider being coupled between a power line and a ground; a second terminal; a first set of one or more adjustable inductors configured to form a resonance circuit with a capacitance across the first and second terminals at one or more communication frequencies of the communication device; and a first coupling circuitry configured to couple between the one or more adjustable inductors and the communication device. In an embodiment, wherein the communication device comprises a receiver and the first coupling circuitry comprises a pass-band filter configured to pass signals at the one or more communication frequencies. In an embodiment, the communication device comprises a transmitter and the first coupling circuitry is configured to match an impedance to an impedance of the resonance circuit. In an embodiment, the communication device comprises a transceiver, and the system comprises: a first signal path including: the first set of one or more adjustable inductors, wherein the first set of one or more adjustable inductors are configured to form the resonance circuit at one or more receiving frequencies of the transceiver; and the first coupling circuitry, wherein the first coupling circuitry comprises a pass-band filter configured to pass signals at the one or more receiving frequencies; and a second signal path including: a second set of one or more adjustable inductors configured to form a resonance circuit with a capacitance across the first and second terminals at one or more transmission frequencies of the transceiver; and impedance matching circuitry; and switching circuitry configured to: in a first mode of operation, couple the first signal path between the first terminal and the transceiver; and in a second mode of operation, couple the second signal path between the first terminal and the transceiver. In an embodiment, the second terminal is configured to couple to the ground. In an embodiment, the second terminal is configured to couple to an intermediate node of a second capacitive voltage divider, the second capacitive voltage divider being coupled between a second power line and the ground. In an embodiment, the impedance matching circuitry comprises: a transformer having a primary winding coupled to the ground and a secondary winding galvanically isolated from the primary winding; and an adjustable inductance-capacitance network coupled to the secondary winding.

In an embodiment, a method comprises: coupling one or more adjustable inductors to an intermediate node of at least a first capacitive voltage divider to form a resonance circuit with a capacitance associated with the intermediate node of the first capacitive voltage divider at one or more frequencies of a communication device, the first capacitive voltage divider being coupled between a power line and a ground; and coupling the communication device to the one or more adjustable inductors. In an embodiment, the capacitance associated with the intermediate node of the first capacitive voltage divider comprises a capacitance between the intermediate node of the first capacitive voltage divider and the ground. In an embodiment, the capacitance associated with the intermediate node of the first capacitive voltage divider comprises a capacitance between the intermediate node of the first capacitive voltage divider and an intermediate node of a second capacitive voltage divider coupled between a second power line and the ground. In an embodiment, coupling the one or more adjustable inductors to the intermediate node comprises coupling the one or more inductors to a socket of a voltage detection system.

In an embodiment, one or more adjustable inductances may be substantially identical.

DETAILED DESCRIPTION

Figure 1:
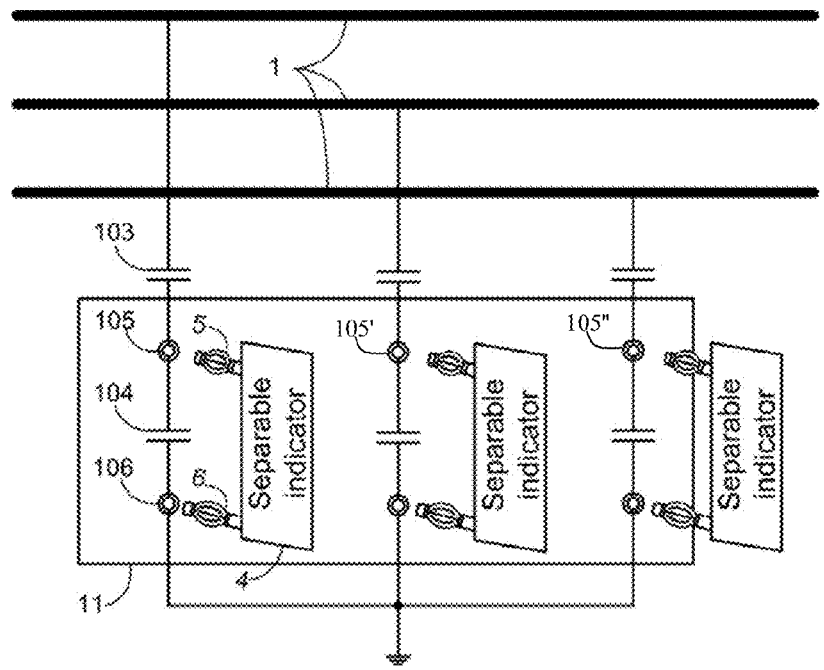
FIG. 1 shows a connection scheme of a three phase voltage detecting system with portable indicators.

In the following description, certain details are set forth in order to provide a thorough understanding of various embodiments of devices, methods and articles. However, one of skill in the art will understand that other embodiments may be practiced without these details. In other instances, well-known structures and methods associated with, for example, power systems, transceivers, receivers, transmitters, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a rectilinear-shaped feature or element does not mean that a feature or element has a geometrically perfect rectilinear shape.

An embodiment of a coupling interface may use the already available Voltage Detecting Systems (VDS), usually installed in the MV switchboards, to inject or receive a PLC signal. Thus no dedicated MV coupler for power line communication has to be installed and thus a high reduction of the costs may be achieved.

The capacitive dividers are a constitutive part of the voltage detecting system, typically installed in the medium voltage switchboards of the major electrical manufacturers all over the world. According to the standard IEC 61243-5 "Live working—Voltage detectors Part 5: Voltage detecting systems," 2002, these devices have to detect the presence or the absence of the voltage on AC electrical systems for voltages from 1 kV to 52 kV and for frequencies from 162/3 Hz to 60 Hz. The standard IEC 61243-5 classifies Voltage Detecting Systems into: integrated systems and separable systems. The integrated ones are fixed and form an integral part of the equipment in which they are installed; the separable ones have a separable indicator that can be connected to a fixed coupling system by means of an interface.

For each of the three phases of the MV power lines a capacitive divider and a voltage indicator are connected. The connection scheme of a three phase voltage detecting system with separable indicators is shown in FIG. 1. The socket panel 11 is composed of three sockets in each of which a plug with the voltage indicator 4 may be inserted. Each socket has a first terminal 106 connected to ground, and a second terminal 105 connected to an intermediate node of one of the three capacitive dividers 103. The capacitance 104 is the equivalent capacitance seen from the terminals 105 and 106, when the plug is not connected.

Figure 2:
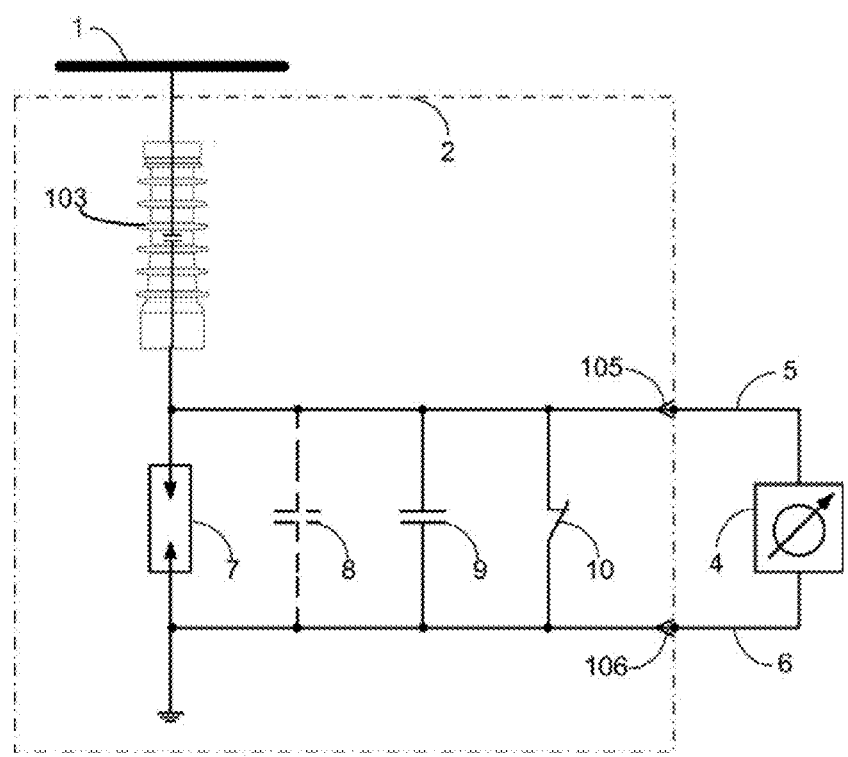
FIG. 2 is a voltage detecting system with portable indicator (separable VDS).

FIG. 2 shows the electrical circuit for one phase of the separable system wherein the separable voltage indicator 4 is connected to the coupling system 2, whose elements will be described in detail in the following.

The standard IEC 61243-5 defines five different separable VDS systems. For each defined system the dimensional characteristic of the sockets and the plug arrangement are set. Moreover the electrical characteristic of the coupling system and the voltage indicator are also defined.

An embodiment of a coupling interface allows connecting a generic low voltage PLC transceiver to any of the different VDS systems. The plug and the separable indicator, usually built in a unique device 4, have to be substituted by a plug of the same size, through which the signal will be injected or received. Thus the PLC signal connection may be implemented in an embodiment without any change inside the MV switchboard, by disconnection of the separable VDS indicator.

In an embodiment, a coupling interface may be either connected in parallel to the capacitance 104, as the separable indicator of common VDS, or between the node 105 and the corresponding node 105' (or 105").

Figure 3:
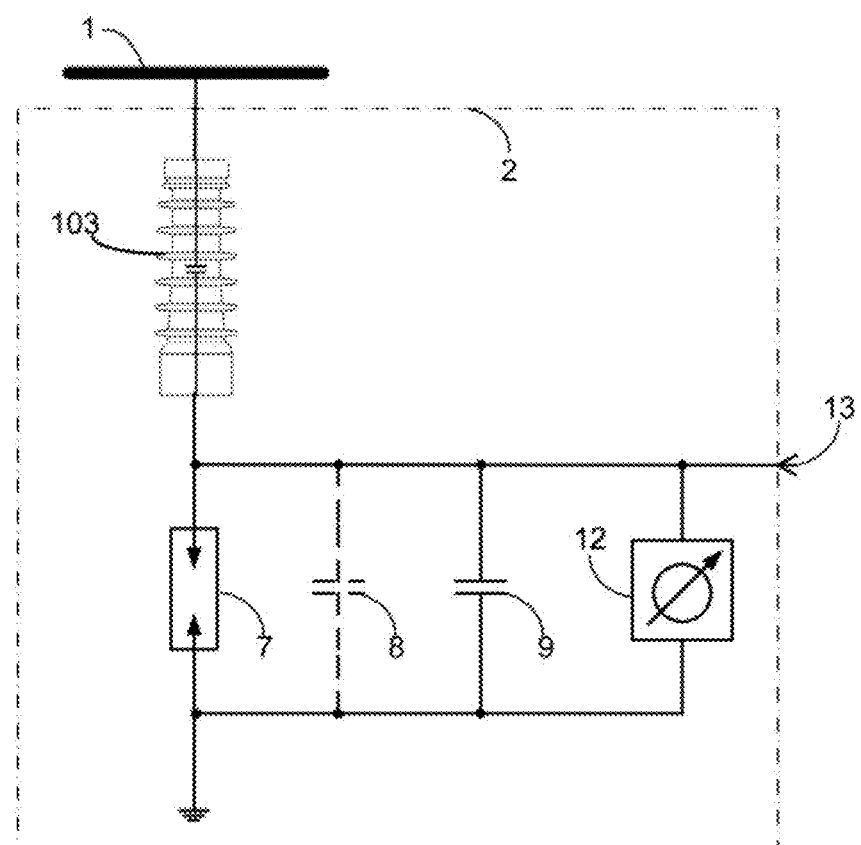
FIG. 3 is a voltage detecting system with integrated indicator (integrated VDS).

In the case of an integrated system, instead, the voltage indicator 12 is built in the MV switchboard, as shown in FIG. 3. An embodiment of a coupling interface may be used also in the case of integrated system. In this case the voltage indicator 12 may be disconnected and signals to be transmitted may be injected through the test point terminal 13. The other terminal of the transmitting/receiving system may be directly connected to ground of the transformer substation or, in case of a three-phase power line, to the test point terminal of a different phase line.

The capacitance 103 has a fixed value. One of its plates is connected to the MV bus-bar 1 and the other plate is available for the voltage detection. A voltage limiting device 7, the stray capacitances 8, the measuring circuit components 9 and a switch 10 (see FIG. 2) for eventually short-circuiting them are usually connected between the second plate and ground. The capacitive behavior at the main frequency of all these elements may be modeled as an equivalent capacitance 104 (FIG. 1). The series of the capacitance 103 and the equivalent capacitance 104 constitute a voltage divider, thus the voltage measured at the sockets 105 and 106 is proportional to the main amplitude voltage. The voltage reduction ratio is determined by the ratio between the values of the two capacitances.

Due to safety reasons the measuring circuit component 9 is usually a capacitance of fixed value chosen in order to have a voltage lower than 100 V at the sockets 8. Therefore the equivalent capacitance 104 must have a larger value than the capacitive divider capacitance 103.

Since the equivalent capacitance 104 is greater than the capacitive divider capacitance 103, the use of the VDS socket panel 11 to inject the PLC signal is not so simple. If a generic low voltage transceiver were connected directly to the sockets, the signal would be short circuited by the capacitance 104, and only a small part of the signal would be driven through the capacitive divider 103 into the cable core.

In an embodiment, an adjustable inductance is connected between the socket terminals such to form a resonant circuit with the capacitances 103 and 104 tuned at the frequency of signals to be transmitted/received, facilitating transmitting a larger part of the energy of a signal on the power line, with a small part thereof dispersed to ground.

The adjustable inductance and other additional components, disclosed hereinafter, may be embedded in an coupling interface, coupled between the generic low voltage transceiver and the VDS (Voltage Detective System) sockets 105 and 106 or 105' in the switchboard front panel.

Figure 4:
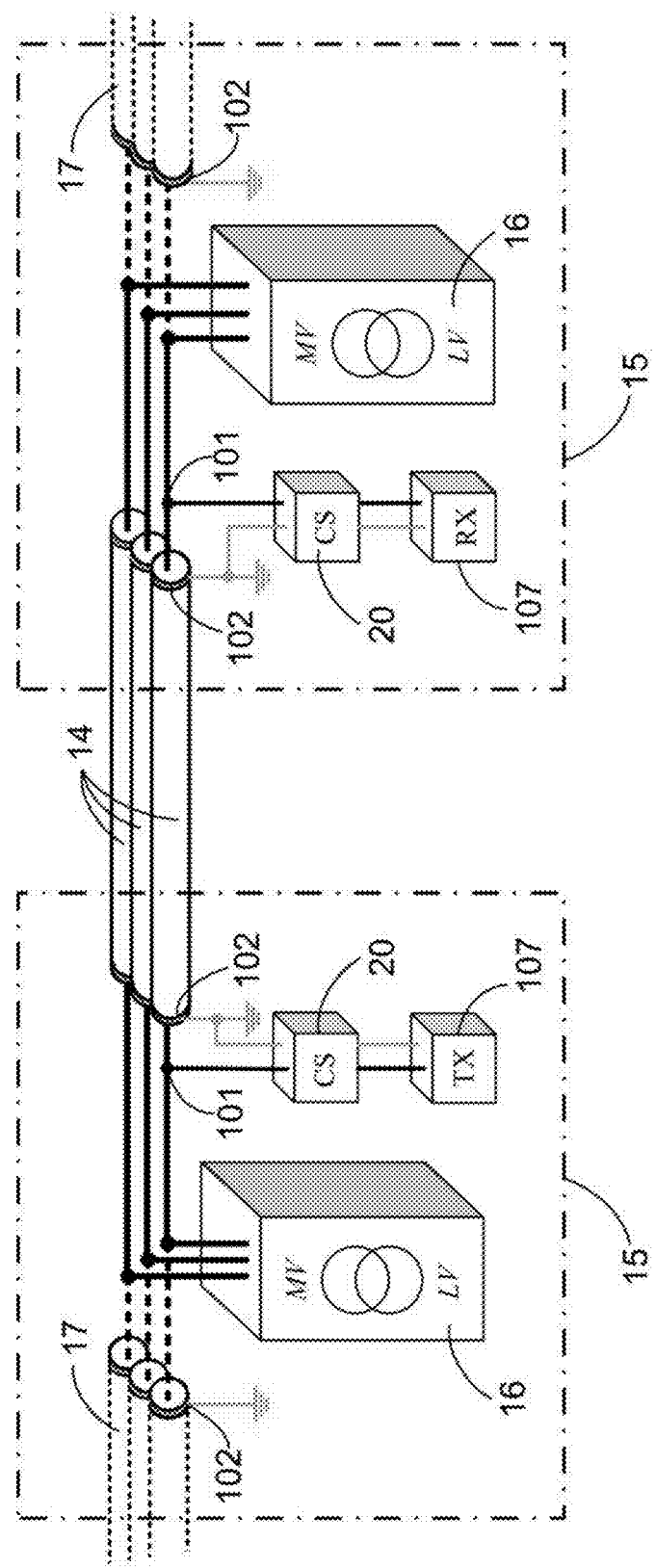
FIG. 4 is a connection scheme of an embodiment of a coupling interface between a medium voltage power line and the respective shield.

The PLC signal may be injected in two configurations: line-shield and line-line. A simple case of transmission in the line-shield configuration between two transformer substations 15 is shown in FIG. 4. For sake of simplicity the protection devices are not shown. Three cables 14 connect the two transformer substations. A MV/LV power transformer 16 is installed in each substation and a second MV line 17 is also connected to the MV bus-bars. The block 20 represents the coupling system for one phase realized as previously explained. The signal is injected between the core of one cable 101 and the shield 102 connected to ground at the ends of the line.

Figure 5:
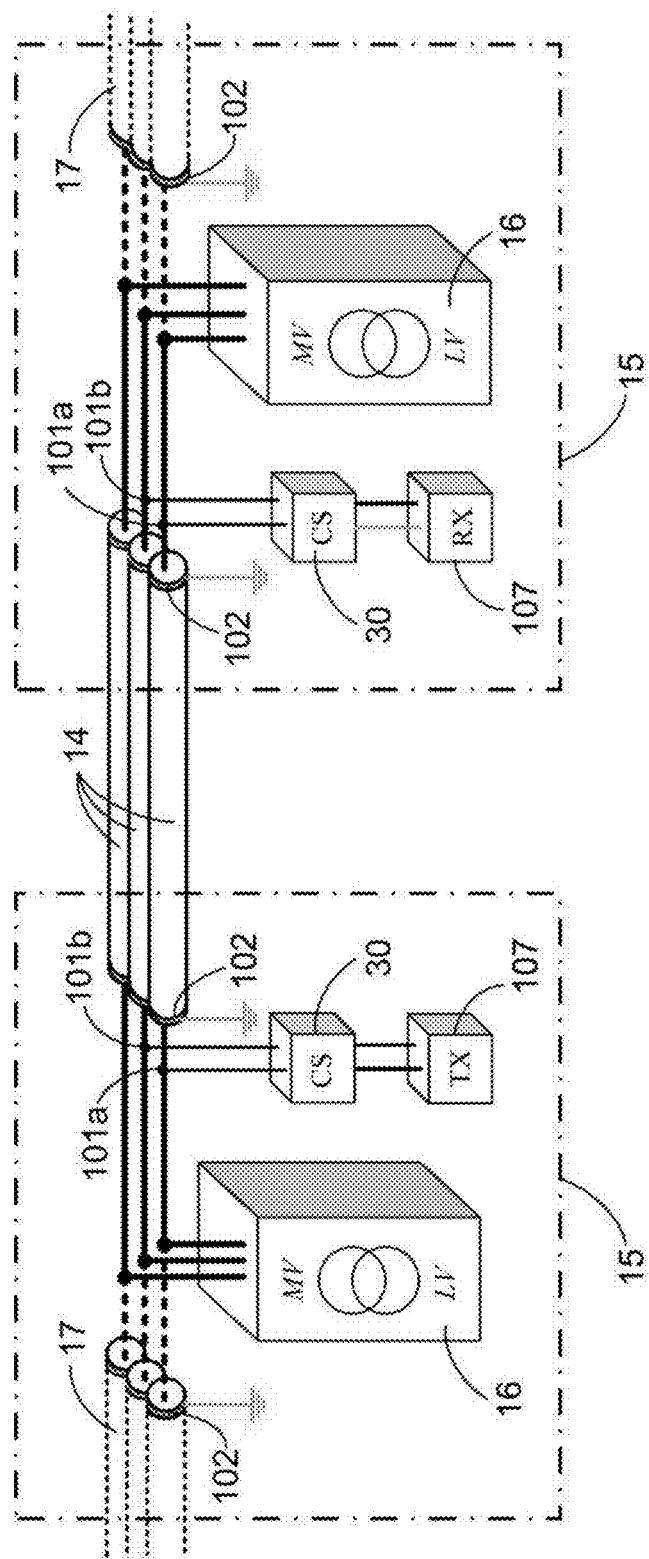
FIG. 5 is a connection scheme of an embodiment of a coupling interface between two medium voltage power lines of a three-phase power line.

In the case of line-line configuration of FIG. 5, instead, the signal is injected between the core of two cables, 101a and 101b. The coupling system in this case uses two capacitive dividers for each substation and a coupling interface including an adjustable inductance.

The two configurations can be also combined: for example transmitting the signal between two or three cable cores in parallel and using the third cable core and/or the shield as common conductor. The parallel will be realized only at the signal frequency thanks to a dedicated coupling interface.

The coupling interface has a plug with the same arrangement suggested by the applicable standard in order to be connected to the correspondent socket whose electrical and dimensional characteristic depends on the different systems of separable voltage indicator 4. In this way the coupling interface may be simply connected to the socket and no energy interruptions are necessary for the installation of the PLC system.

Figure 6:
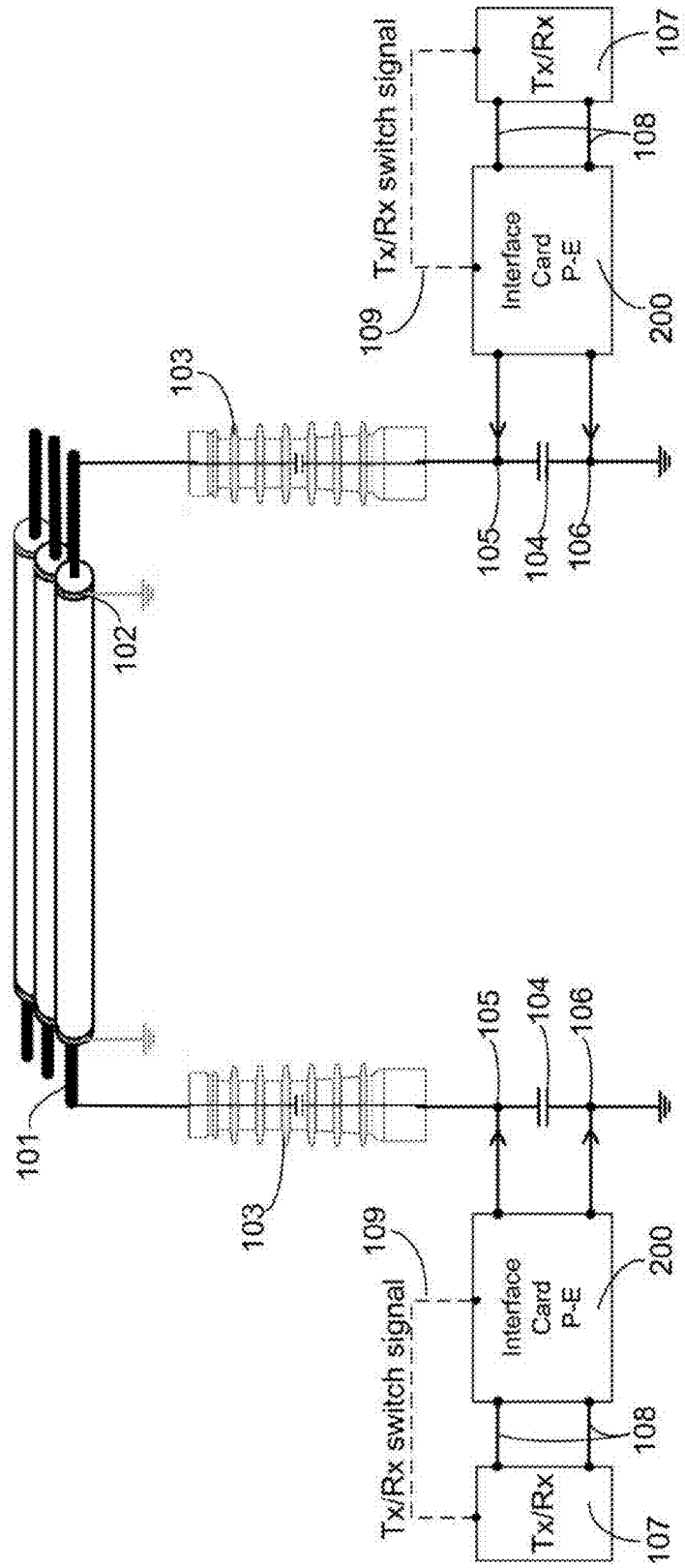
FIG. 6 illustrates how to connect a coupling interface according to the scheme of FIG. 4.

In the case of line-shield configuration, the coupling interface 200 will be connected between a phase terminal 105 and the ground terminal 106, thus in parallel with the capacitance 104, as shown in FIG. 6. The coupling interface 200 will be also connected by 108 to the transceiver 107, which will transmit or receive the PLC signal. A further connection 109 between the coupling interface 200 and the transceiver 107 may be employed to switch the coupling interface operation from transmission Tx to reception Rx and vice versa.

Figure 7:
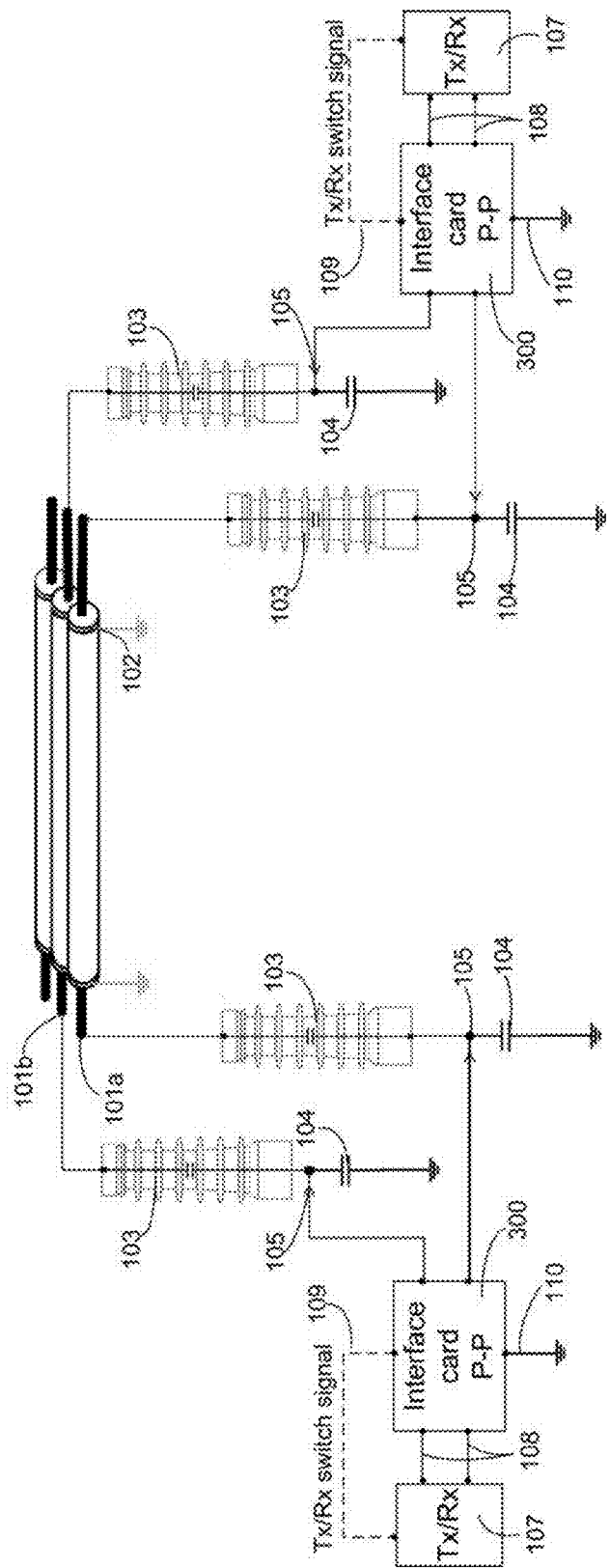
FIG. 7 illustrates how to connect a coupling interface according to the scheme of FIG. 5.

In the case of line-line configuration, the coupling interface 300 will be connected between two phase sockets 105, as shown in FIG. 7.

A further terminal 110 is used to ground the coupling interface.

The transceiver signal is connected by 108 to the coupling interface 300. The Tx/Rx switch signal generated by the transceiver is connected by 109 to the coupling interface.

Figure 8:
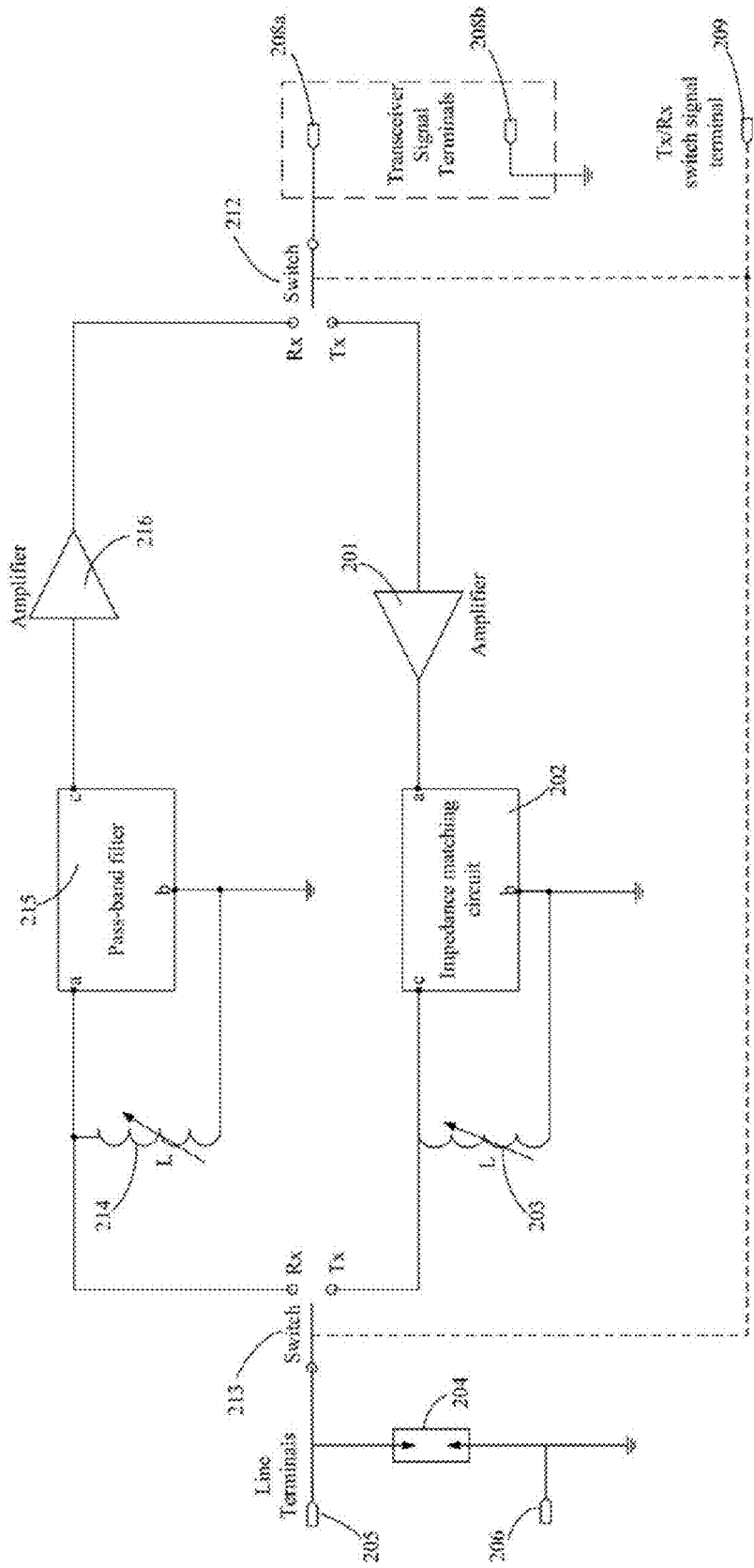
FIG. 8 depicts an embodiment of a coupling interface adapted to be connected according to the scheme of FIG. 6.

An embodiment of the line-shield coupling interface 200 is shown in FIG. 8. The line terminals 205 and 206 are connected with a plug of standard size, such as the one of the separable indicator plug 4 of FIG. 1, to the sockets 105 and 106. A voltage limiting device 204 is connected to the terminals 205 and 206 to protect the electronic card from severe voltage transients. The voltage limiting device 204 is chosen in order to have a low capacitance to avoid a short circuit for the communicating signal.

A different circuit may be selected for the two cases: transmission and reception. The selection of the desired circuit is fulfilled by the switches 212 and 213. These switches are controlled by the Tx/Rx switch signal 109 from the transceiver. The Tx/Rx switch signal 109 coming from the transceiver is connected to the coupling interface terminal 209. In the case of line-shield configuration, the PLC signal is referred to ground, thus terminal 208b is connected to ground.

Figure 9:
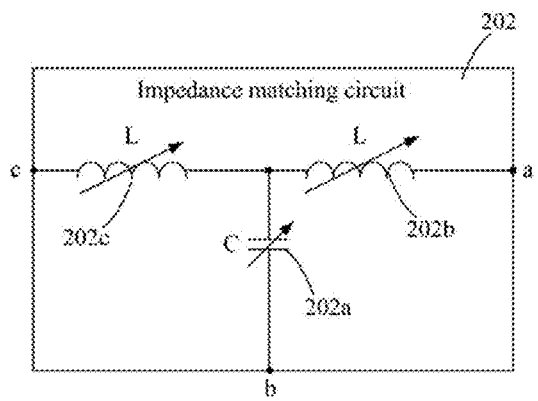
FIG. 9 depicts a L-C impedance matching circuit adapted for an interface connected according to the scheme of FIG. 6.

When the switches 212 and 213 are commuted to the Tx position, the signal transmitted by the transceiver is amplified by the amplifier 201 and then applied to the impedance matching circuit 202, which is configured to match the impedance seen by the amplifier to its output impedance. As an example in FIG. 9 a simple way to realize the impedance matching circuit, with passive components, is shown. The inductances 202c, 202b and the capacitance 202a may have an adjustable value. A simpler version of the impedance matching circuit may be obtained without the inductance 202c.

The adjustable inductance 203 may be adjusted in order to be in resonance at the signal frequency with the capacitance 104. The parallel group formed by the inductance 203 and the capacitance 104 becomes in this way a high impedance for the PLC signal, instead of a short circuit by the capacitance 104 to ground. Thus facilitating a higher portion of the signal crossing the capacitive divider 103 and reaching the cable core 101.

Figure 10:
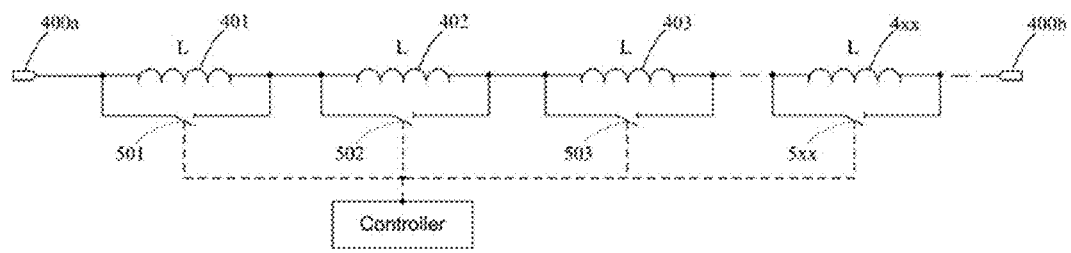
FIG. 10 illustrates an embodiment of an adjustable inductance fixed by a controller.

An example to obtain an inductance of variable value is to connect in series or in parallel several inductances of different value. The inductances which have not to be connected may be short circuited in an embodiment. A possible circuit to obtain an adjustable inductance, useful for the coupling interface, is shown in FIG. 10. Numerous inductances 401, 402, 403 . . . 4xx are connected in series and may be shorted by the controlled switches 501, 502, 503 . . . 5xx.

Figure 11:
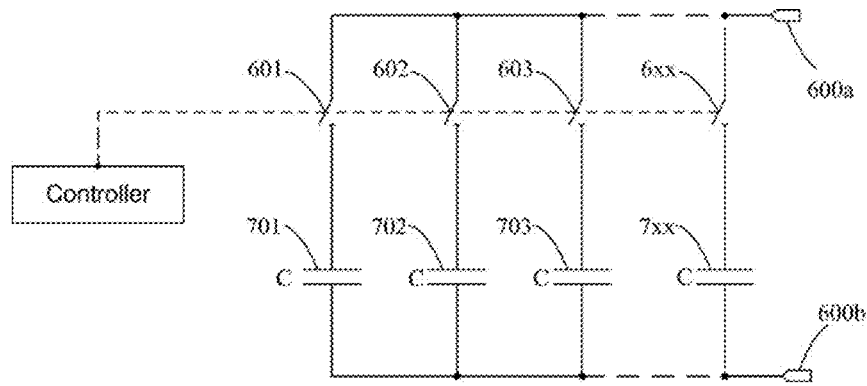
FIG. 11 illustrates an embodiment of an adjustable capacitance fixed by a controller.

In the same way it is possible to realize a capacitance of variable value by using capacitances of different values connected in series. Another possible way is to connect the inductances or the capacitances in parallel. In FIG. 11 the parallel configuration with capacitances of different value is shown. A combination of the two solutions may be easily obtained and for this reason it is not shown in the figures.

When the transceiver is in reception mode, the switches 212 and 213 are commuted to the Rx position and the adjustable inductance 214 is in parallel with the line terminals 205 and 206.

The inductance 214 as well as in transmission the inductance 203 have also a supplementary task: the voltage at the main frequency is short circuited at the input terminals 205 and 206 thanks to the very low value of the inductances 214 and 203 at the main frequency and its harmonics. The pass band filter 215 filters both the disturbing high frequencies and the residual low frequency components.

Figure 12:
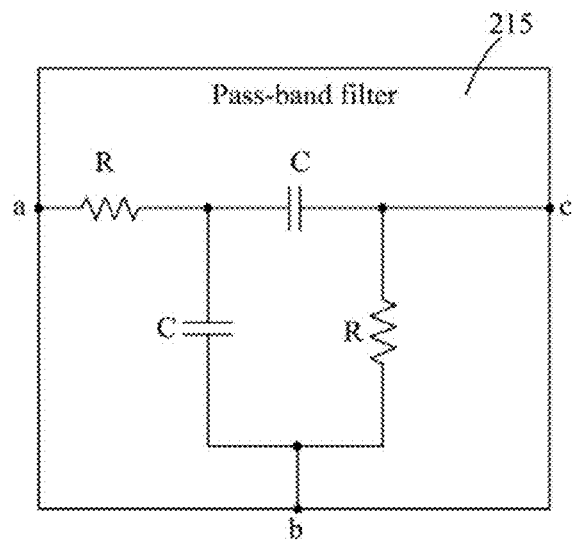
FIG. 12 depicts a R-C pass-band filter.

As an example in FIG. 12 a simple pass-band filter realized with passive components is shown. The received and filtered signal is then buffered and amplified by the amplifier 216 and finally received by the transceiver, connected at the terminals 208a and 208b.

Figure 13:
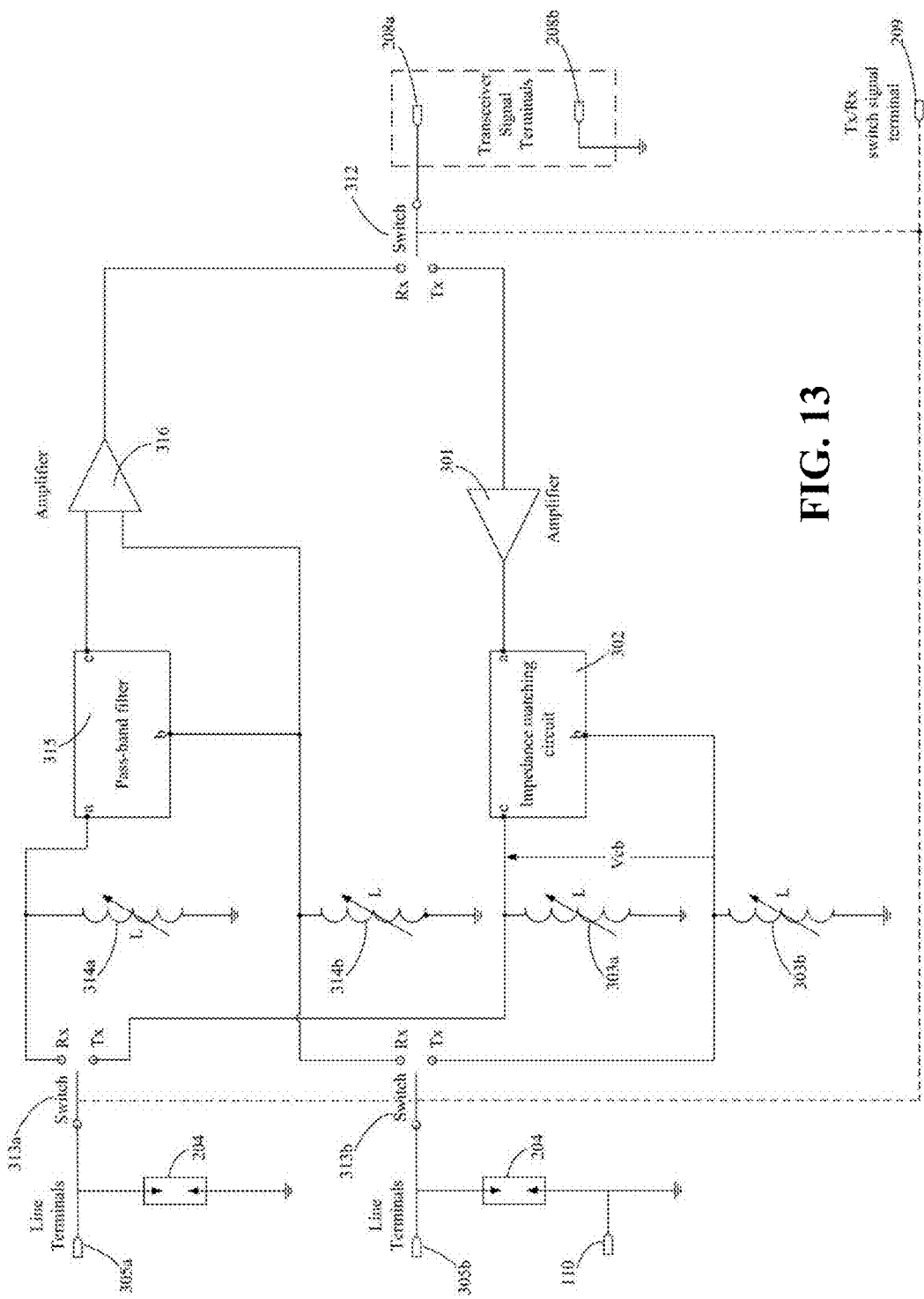
FIG. 13 depicts an embodiment of a coupling interface adapted to be connected according to the scheme of FIG. 7.

The electrical scheme of the line-line coupling interface 300 is shown in FIG. 13. The terminals 305a and 305b are connected to the two phase sockets 105, a further terminal 110 is connected to ground. A voltage limiting device 204 is connected between each of the two terminals 305a and 305b and the ground, to protect the electronic card from voltage transients. The switches 312, 313a and 313b select the transmission or reception circuit. The switches are controlled by the Tx/Rx switch signal received by the transceiver.

When the switches are commuted to the Tx position, the signal transmitted by the transceiver is amplified by the amplifier 301. The amplifier output is connected to an impedance matching circuit 302.

Figure 14:
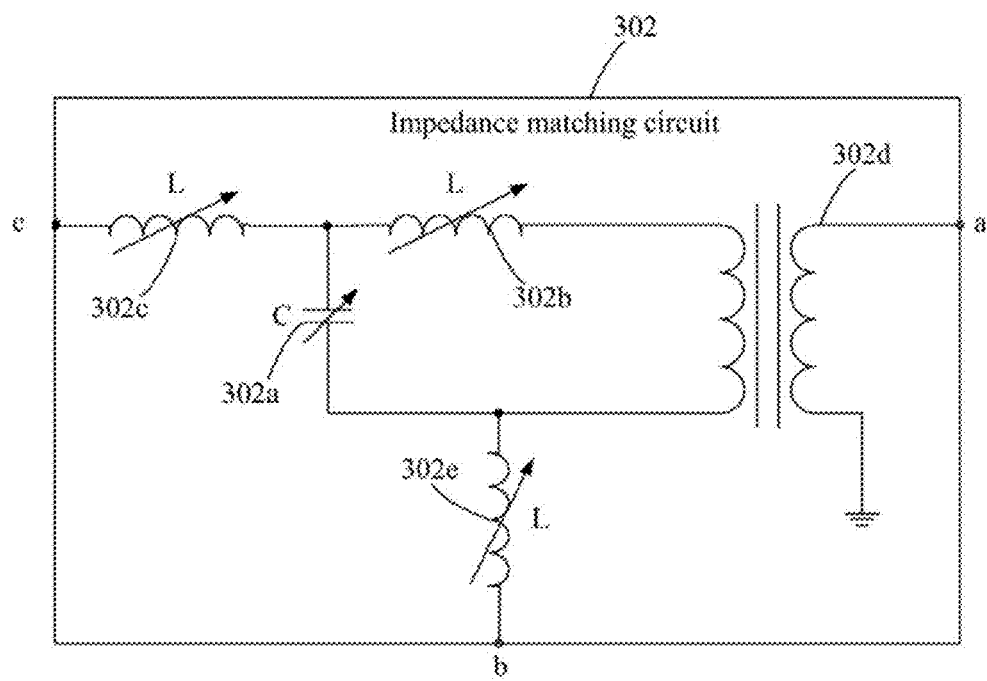
FIG. 14 depicts a L-C impedance matching circuit adapted for an interface connected according to the scheme of FIG. 7.

An embodiment of the impedance matching circuit with passive components is shown in FIG. 14. A simpler version of the impedance matching circuit may be obtained without the inductances 302c and 302e. An isolation transformer 302d is connected between the terminal a and the ground, in order to convert the signal from single-ended to differential. The signal generated from the transceiver, in fact, is referred to ground. The impedance matching circuit output signal (Vcb), instead, is differential, in order to be sent to the two line terminals 305a and 305b connected to the phase sockets 105.

The adjustable inductances 303a and 303b are connected at the two terminals 305a and 305b. Each of these two inductances may be adjusted in order to drive a larger part of the signal to the cable core and reduce the part of the signal short circuited to ground by forming a resonant circuit together with the capacitance connected thereto.

When the transceiver is in reception, the switches 312, 313a and 313b are commuted to Rx. The inductances 314a and 314b are adjusted to be in resonance with the equivalent impedance seen from the terminals 305a and 305b and the ground. The received differential signal is filtered by a passband filter 315, that may be the one of FIG. 12. The filtered signal is then buffered and amplified by a differential amplifier 316 and finally received by the transceiver, connected at the terminals 208a and 208b.

The claims as filed are integral part of this description and are herein incorporated by reference.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A coupling interface, comprising:
a first terminal configured to couple to an intermediate node of a capacitive voltage divider, the capacitive voltage divider being coupled between a power line and a ground;
a second terminal;
a third terminal configured to couple to a communication device;
a first set of one or more adjustable inductors configured to form a resonance circuit with a capacitance of the capacitive divider across the first and second terminals at one or more communication frequencies; and
a first coupling circuitry configured to couple between the one or more adjustable inductors and the third terminal.

2. The coupling interface of claim 1 wherein the first coupling circuitry comprises a pass-band filter configured to pass signals at the one or more communication frequencies.

3. The coupling interface of claim 1 wherein the first coupling circuitry is configured to match an impedance to an impedance of the resonance circuit.

4. The coupling interface of claim 1, comprising:
a first signal path including:
the first set of one or more adjustable inductors, wherein the first set of one or more adjustable inductors are configured to form the resonance circuit at one or more receiving frequencies of the one or more communication frequencies; and
the first coupling circuitry, wherein the first coupling circuitry comprises a pass-band filter configured to pass signals at the one or more receiving frequencies; and
a second signal path including:
a second set of one or more adjustable inductors configured to form a resonance circuit with a capacitance across the first and second terminals at one or more transmission frequencies of the one or more communication frequencies; and
impedance matching circuitry; and
switching circuitry configured to:
in a first mode of operation, couple the first signal path between the first terminal and the third terminal; and
in a second mode of operation, couple the second signal path between the first terminal and the third terminal.

5. The coupling interface of claim 4 wherein the second terminal is configured to couple to a ground.

6. The coupling interface of claim 1 wherein the second terminal is configured to couple directly to a ground.

7. The coupling interface of claim 4 wherein the first signal path comprises an amplifier having an input coupled to the pass-band filter and the second signal path comprises an amplifier having an output coupled to the impedance matching circuitry.

8. The coupling interface of claim 4 comprising an integrated circuit including the first and second signal paths and the switching circuitry.

9. A coupling interface, comprising:
a first terminal configured to couple to an intermediate node of a capacitive voltage divider, the capacitive voltage divider being coupled between a power line and a ground;
a second terminal;
a third terminal configured to couple to a communication device;
a first set of one or more adjustable inductors configured to form a resonance circuit with a capacitance across the first and second terminals at one or more communication frequencies; and
a first coupling circuitry configured to couple between the one or more adjustable inductors and the third terminal, wherein the second terminal is configured to couple to an intermediate node of a second capacitive voltage divider, the second capacitive voltage divider being coupled between a second power line and the ground.

10. The coupling interface of claim 9, comprising:
a first signal path including:
the first set of one or more adjustable inductors, wherein the first set of one or more adjustable inductors are configured to form the resonance circuit at one or more receiving frequencies of the one or more communication frequencies; and
the first coupling circuitry, wherein the first coupling circuitry comprises a pass-band filter configured to pass signals at the one or more receiving frequencies; and
a second signal path including:
a second set of one or more adjustable inductors configured to form a resonance circuit with a capacitance across the first and second terminals at one or more transmission frequencies of the one or more communication frequencies; and
impedance matching circuitry; and
switching circuitry configured to:
in a first mode of operation, couple the first signal path between the first terminal and the third terminal; and
in a second mode of operation, couple the second signal path between the first terminal and the third terminal,
wherein the switching circuitry is configured to:
in the first mode of operation, couple a first adjustable inductor of the first set of one or more adjustable inductors to the first terminal and a second adjustable inductor of the first set of one or more adjustable inductors to the second terminal; and in the second mode of operation, couple a first adjustable inductor of the second set of one or more adjustable inductors to the first terminal and a second adjustable inductor of the second set of adjustable inductors to the second terminal.

11. The coupling interface of claim 10 wherein the first and second adjustable inductors of the second set of one or more adjustable inductors are coupled to the impedance matching circuitry.

12. The coupling interface of claim 11 wherein the impedance matching circuitry comprises:
a transformer having a primary winding coupled to the ground and a secondary winding galvanically isolated from the primary winding; and
an adjustable inductance-capacitance network coupled to the secondary winding.

13. The coupling interface of claim 12 wherein in the second mode of operation, the switching circuitry is configured to couple the primary winding to the third terminal.

14. The coupling interface of claim 10 wherein the first and second adjustable inductors of the first set of one or more adjustable inductors are coupled to the pass-band filter.

15. A system, comprising:
a communication device; and
a coupling interface, including:
a first terminal configured to couple to an intermediate node of a capacitive voltage divider, the capacitive voltage divider being coupled between a power line and a ground;
a second terminal;
a first set of one or more adjustable inductors configured to form a parallel resonance circuit with a capacitance across the first and second terminals at one or more communication frequencies of the communication device; and
a first coupling circuitry configured to couple between the one or more adjustable inductors and the communication device.

16. The system of claim 15 wherein the communication device comprises a receiver and the first coupling circuitry comprises a pass-band filter configured to pass signals at the one or more communication frequencies.

17. The system of claim 15 wherein the communication device comprises a transmitter and the first coupling circuitry is configured to match an impedance to an impedance of the resonance circuit.

18. The system of claim 15 wherein the communication device comprises a transceiver, the system comprising:
a first signal path including:
the first set of one or more adjustable inductors, wherein the first set of one or more adjustable inductors are configured to form the resonance circuit at one or more receiving frequencies of the transceiver; and
the first coupling circuitry, wherein the first coupling circuitry comprises a pass-band filter configured to pass signals at the one or more receiving frequencies; and
a second signal path including:
a second set of one or more adjustable inductors configured to form a resonance circuit with a capacitance across the first and second terminals at one or more transmission frequencies of the transceiver; and
impedance matching circuitry; and
switching circuitry configured to:
in a first mode of operation, couple the first signal path between the first terminal and the transceiver; and
in a second mode of operation, couple the second signal path between the first terminal and the transceiver.

19. The system of claim 18 wherein the second terminal is configured to couple to the ground.

20. The system of claim 18 wherein the second terminal is configured to couple to an intermediate node of a second capacitive voltage divider, the second capacitive voltage divider being coupled between a second power line and the ground.

21. The system of claim 18 wherein the impedance matching circuitry comprises:
a transformer having a primary winding coupled to the ground and a secondary winding galvanically isolated from the primary winding; and
an adjustable inductance-capacitance network coupled to the secondary winding.

22. A system, comprising:
first means for coupling a transceiver to a first capacitive voltage divider of a power transmission system;
second means for coupling the transceiver to the first capacitive voltage divider of the power transmission system; and
means for selecting one of the first and second means for coupling to couple the transceiver to the power transmission system.

23. The system of claim 22 wherein the first means for coupling is configured to couple to a second capacitive voltage divider of the power transmission system and the second means for coupling is configured to couple to the second capacitive voltage divider of the power transmission system.

24. The system of claim 23 wherein the means for selecting is configured to:
when the first means for coupling is selected, couple a first adjustable inductor of the first means for coupling to the first capacitive voltage divider and a second adjustable inductor of the first means for coupling to the second capacitive voltage divider; and
when the second means for coupling is selected, couple a first adjustable inductor of the second means for coupling to the first capacitive voltage divider and a second adjustable inductor of the second means for coupling to the second capacitive voltage divider.

25. The system of claim 24 wherein the second means for coupling comprises:
a transformer having a primary winding coupled to a ground and a secondary winding galvanically isolated from the primary winding; and
an adjustable inductance-capacitance network coupled to the secondary winding.

26. A method, comprising:
coupling one or more adjustable inductors to an intermediate node of at least a first capacitive voltage divider to form a parallel resonance circuit with a capacitance associated with the intermediate node of the first capacitive voltage divider at one or more frequencies of a communication device, the first capacitive voltage divider being coupled between a power line and a ground; and
coupling the communication device to the one or more adjustable inductors.

27. The method of claim 26 wherein the capacitance associated with the intermediate node of the first capacitive voltage divider comprises a capacitance between the intermediate node of the first capacitive voltage divider and the ground.

28. The method of claim 26 wherein the capacitance associated with the intermediate node of the first capacitive voltage divider comprises a capacitance between the intermediate node of the first capacitive voltage divider and an intermediate node of a second capacitive voltage divider coupled between a second power line and the ground.

29. The method of claim 26 wherein coupling the one or more adjustable inductors to the intermediate node comprises coupling the one or more inductors to a socket of a voltage detection system.

* * * * *